(12) United States Patent
Kozuka

(10) Patent No.: US 8,516,430 B2
(45) Date of Patent: Aug. 20, 2013

(54) TEST APPARATUS AND CIRCUIT APPARATUS

(75) Inventor: Noriyoshi Kozuka, Ibaraki (JP)

(73) Assignee: Advantest Corporation, Tokyo (JP)

( * ) Notice: Subject to any disclaimer, the term of this patent is extended or adjusted under 35 U.S.C. 154(b) by 791 days.

(21) Appl. No.: 12/687,086

(22) Filed: Jan. 13, 2010

(65) Prior Publication Data

US 2010/0189003 A1 Jul. 29, 2010

Related U.S. Application Data

(63) Continuation of application No. PCT/JP2007/064101, filed on Jul. 17, 2007.

(51) Int. Cl.
*G06F 17/50* (2006.01)

(52) U.S. Cl.
USPC .......................................... 716/136; 716/108

(58) Field of Classification Search
USPC .................. 716/108, 136; 714/30, 741, 742; 702/117, 124
See application file for complete search history.

(56) References Cited

U.S. PATENT DOCUMENTS

| | | | |
|---|---|---|---|
| 2003/0005375 A1 | 1/2003 | Krech, Jr. et al. | |
| 2004/0193990 A1 | 9/2004 | Ichiyoshi | |
| 2004/0210798 A1 | 10/2004 | Higashi | |
| 2004/0225465 A1 | 11/2004 | Pramanick et al. | |
| 2004/0255216 A1* | 12/2004 | Ichiyoshi | 714/742 |
| 2005/0039079 A1 | 2/2005 | Higashi et al. | |
| 2005/0257087 A1* | 11/2005 | Goff | 714/30 |
| 2006/0018321 A1* | 1/2006 | Yamada et al. | 370/392 |

FOREIGN PATENT DOCUMENTS

| | | |
|---|---|---|
| JP | 60-100064 A | 6/1985 |
| JP | 63-298177 A | 12/1988 |
| JP | H06-094804 A | 4/1994 |
| JP | 8-043480 A | 2/1996 |
| JP | 3067794 U | 4/2000 |
| JP | 2006-053160 A | 2/2006 |
| JP | 2006-172173 A | 6/2006 |
| WO | 2007/036048 A1 | 4/2007 |

OTHER PUBLICATIONS

Taiwanese Office Action dated Jan. 12, 2012, in a counterpart Taiwanese patent application No. 097127212. (This Taiwanese OA cites JP2006-053160, JP8-43480, and JP63-298177).

(Continued)

*Primary Examiner* — Vuthe Siek

(57) ABSTRACT

There is provided a test apparatus for testing a device under test, including a plurality of operational units that operate in response to control data supplied thereto to test the device under test, a control section that generates packet data containing the control data and unit selection data indicating which one or more of the plurality of operational units are to be selected, and a plurality of data transfer units that are cascade-connected to each other so that the packet data is transferred from each of the plurality of data transfer units to a data transfer unit of a following stage, where each of the plurality of data transfer units corresponds to one or more of the plurality of operational units. Here, when each of the plurality of data transfer units receives the packet data whose unit selection data indicates that one or more of the operational units corresponding thereto are to be selected, the data transfer unit inputs the control data contained in the packet data into the selected operational units or reads data from the selected operational units.

16 Claims, 5 Drawing Sheets

(56) References Cited

OTHER PUBLICATIONS

Korean Office Action dated Feb. 13, 2012, in a counterpart Korean patent application No. 10-2010-7003105. (This Korean OA cites JP2006-053160).

Japanese Office Action dated May 22, 2012, in a counterpart Japanese patent application No. 2009-523473. (This Japanese OA cites Foreign Patent document Nos. 1-3 and JP2006-053160).

International Search Report (ISR) issued in PCT/JP2007/064101 (parent application) for Examiner consideration, citing U.S. Patent Application Publication Nos. 3-6 and Foreign Patent Document Nos. 1-5 listed above.

Written Opinion (PCT/ISA/237) issued in PCT/JP2007/064101 (parent application).

* cited by examiner

TEST APPARATUS AND CIRCUIT APPARATUS

BACKGROUND

1. Technical Field

The present invention relates to a test apparatus and a circuit apparatus. More particularly, the present invention relates to a test apparatus designed to test a device under test and a circuit device for use in the test apparatus.

2. Related Art

Writing/reading operations are performed between a semiconductor test apparatus and a plurality of LSIs by means of a known bus interface scheme. For example, Patent Document 1 discloses a bus interface scheme that enables writing/reading operations to be performed between a CPU and a plurality of devices such as LSIs in a complex manner of selections.

Patent Document 1: Japanese Utility Model No. 3067794

According to the above-mentioned bus interface scheme, however, an increase in the number of devices results in an increase in the number of buses connecting the CPU and the devices to each other. Therefore, a large number of devices means a large number of buses, which leads to a large number of signals transmitted through the buses.

SUMMARY

Therefore, it is an object of an aspect of the innovations herein to provide a test apparatus and a circuit apparatus which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary test apparatus for testing a device under test may include a plurality of operational units that operate in response to control data supplied thereto to test the device under test, a control section that generates packet data containing the control data and unit selection data indicating which one or more of the plurality of operational units are to be selected, and a plurality of data transfer units that are cascade-connected to each other so that the packet data is transferred from each of the plurality of data transfer units to a data transfer unit of a following stage, where each of the plurality of data transfer units corresponds to one or more of the plurality of operational units. Here, when each of the plurality of data transfer units receives the packet data whose unit selection data indicates that one or more of the operational units corresponding thereto are to be selected, the data transfer unit inputs the control data contained in the packet data into the selected operational units or reads data from the selected operational units. A circuit apparatus is also provided.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
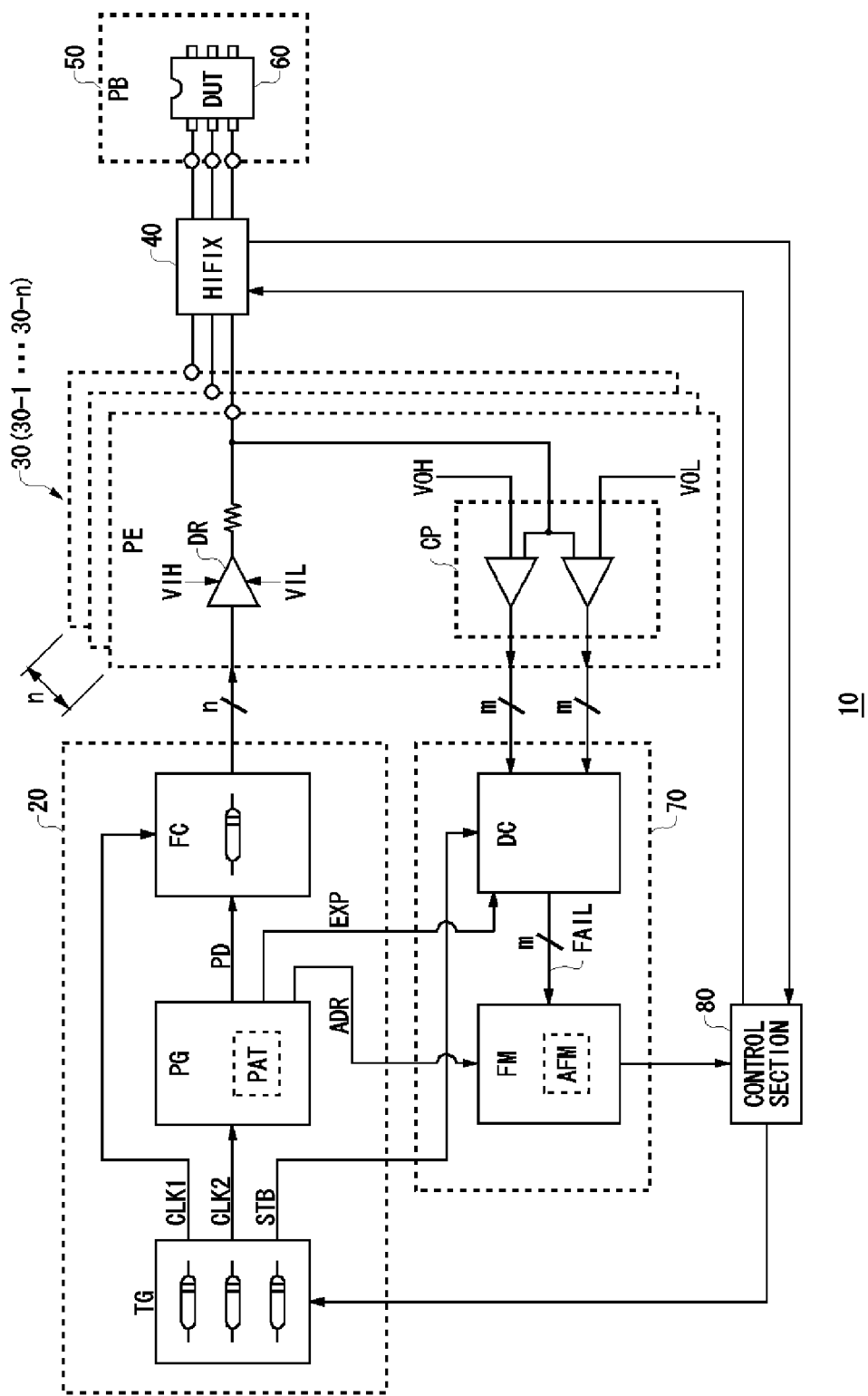
FIG. 1 illustrates the configuration of a test apparatus 10 relating to an embodiment of the present invention.

FIG. 1 illustrates the configuration of a test apparatus 10 relating to an embodiment of the present invention. The test apparatus 10 includes a signal generating section 20, a pin electronics 30, a HIFIX 40, a performance board 50, a measuring section 70, and a control section 80. The test apparatus 10 is designed to test a device under test 60 mounted on the performance board 50 by supplying a variety of test signals to the device under test 60 and measuring response signals from the device under test 60.

The signal generating section 20 generates a variety of test signals based on control signals from the control section 80 and sends the generated test signals to the pin electronics 30. The pin electronics 30 provides a plurality of channels (30-1, . . . 30-n), converts the test signals sent from the signal generating section 20 into voltage levels depending on the characteristics of the device under test 60 and the types of tests to be performed, and sends the resulting test signals to the performance board 50. The performance board 50 has the device under test 60 received in the socket (not shown) of the substrate thereof, and applies the received test signals to the device under test 60. The performance board 50 also sends response signals output from the device under test 60 to the pin electronics 30. The pin electronics 30 sends the response signals output from the device under test 60 mounted on the performance board 50 to the measuring section 70. The measuring section 70 judges, at a predetermined timing, the timings of the response signals received from the device under test 60 via the performance board 50 and the pin electronics 30, and stores resultant fail signals FAIL into a fail memory FM.

The HIFIX 40 is provided between the pin electronics 30 and the performance board 50. The HIFIX 40 has therein several thousand or more coaxial cables transmitting the test and response signals, a plurality of control circuits (operational units), a large number of control relays (not shown), and other control elements (not shown). For example, the HIFIX 40 has therein control circuits that switch the connections between the device under test 60 and the pin electronics 30 (30-1, . . . 30-n) and the test conditions in accordance with the control signals from the control section 80. The control section 80 has a serial control bus and supplies via the control bus control signals to control writing/reading operations to the above-mentioned switching circuits and the like of the HIFIX 40. The control signals supplied from the control section 80 to the HIFIX 40 via the control bus may include, for example, serial data (SD1), a clock signal (CLK), and an enable signal (ENB).

Figure 2:
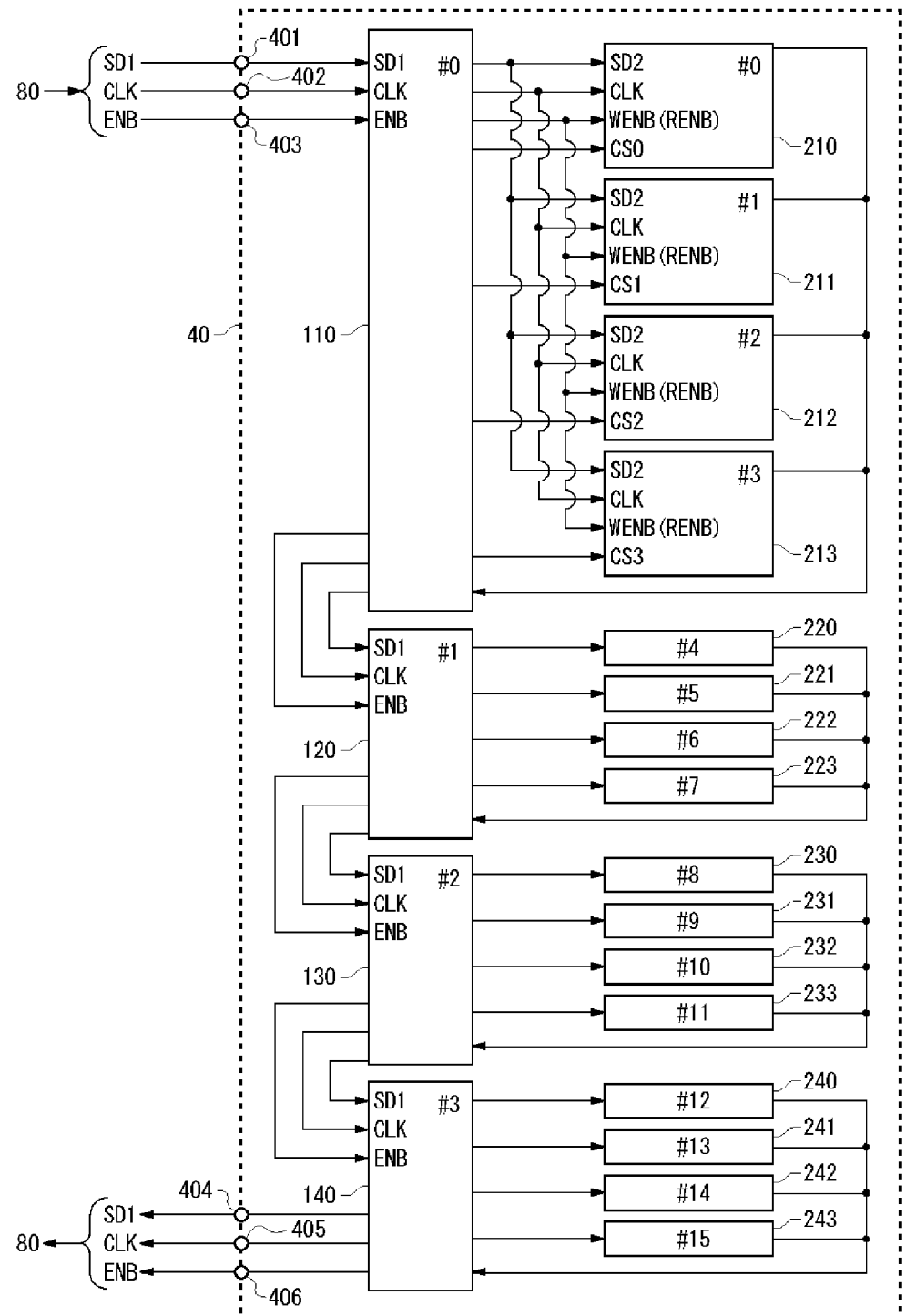
FIG. 2 illustrates a specific example of the internal structure of a HIFIX 40.

FIG. 2 illustrates a specific example of the internal structure of the HIFIX 40. In FIG. 2, data transfer units 120, 130, and 140 have the same configuration as a data transfer unit 110, and operational units 220, 221, 222, 223, 230, 231, 232, 233, 240, 241, 242, and 243 have the same configuration as operational units 210, 211, 212 and 213. Thus, the data transfer units 120, 130, and 140 and the operational units 220, 221, 222, 223, 230, 231, 232, 233, 240, 241, 242, and 243 are illustrated in a simplified manner. Here, each operational unit includes a plurality of I/O port terminals and controls the operations of control relays connected to the I/O port terminals and other control elements, although FIG. 2 does not show this.

The HIFIX 40 includes a serial data input terminal 401, a clock signal input terminal 402, and an enable signal input terminal 403 each of which is connected at one end thereof to the sender control bus of the control section 80. The HIFIX 40 also includes a serial data output terminal 404, a clock signal output terminal 405, and an enable signal output terminal 406 each of which is connected at one end thereof to the receivers control bus of the control section 80.

The HIFIX 40 includes a serial data input terminal 401, a clock signal input terminal 402, and an enable signal input terminal 403 each of which is connected at one end thereof to a control bus that is connected to the control section 80. The HIFIX 40 also includes a serial data output terminal 404, a clock signal output terminal 405, and an enable signal output terminal 406 each of which is connected at one end thereof to a control bus that is connected to the control section 80.

Furthermore, the HIFIX 40 includes four data transfer units 110, 120, 130, and 140, each of which is connected to four operational units. Specifically speaking, the data transfer unit 110 #0 is connected to four operational units, namely, the operational unit 210 #0, the operational unit 211 #1, the operational unit 212 #2, and the operational unit 213 #3. Similarly, the data transfer unit 120 #1 is connected to four operational units 220, 221, 222, and 223 #4 to #7, the data transfer unit 130 #2 is connected to four operational units 230, 231, 232, and 233 #8 to #11, and the data transfer unit 140 #3 is connected to four operational units 240, 241, 242, and 243 #12 to #15.

As described above, four operational units are connected to each of the four data transfer units 110, 120, 130 and 140. Each operational unit includes a control relay for establishing and switching the connection between one of the terminals of the device under test 60 and the transmission path (not shown) of one or more pieces of pin electronics 30 of the test apparatus 10, and other control elements. When the test apparatus 10 starts testing the device under test 60, each operational unit refers to, for example, configuration information included in the control signals received from the control section 80 to determine which terminal of the pin electronics 30 to which the operational unit is connected is to be connected to the device under test 60. Here, the configuration of each operational unit can be altered by means of control data, described later, input into the operational unit.

As shown in FIG. 2, the four data transfer units 110, 120, 130 and 140 are cascade-connected to each other. Specifically speaking, the input end of the data transfer unit 110 #0 is connected to the serial data input terminal 401, the clock signal input terminal 402, and the enable signal input terminal 403 of the HIFIX 40, the output end of the data transfer unit 110 #0 is connected to the input end of the data transfer unit 120 #1. In the same manner, the output end of the data transfer unit 120 #1 is connected to the input end of the data transfer unit 130 #2. The output end of the data transfer unit 130 #2 is connected to the input end of the data transfer unit 140 #3. The output end of the data transfer unit 140 #3 is connected to the serial data output terminal 404, the clock signal output terminal 405, and the enable signal output terminal 406 of the HIFIX 40.

The serial data (SD1), the clock signal (CLK), and the enable signal (ENB), which are control signals supplied from the control section 80 to the HIFIX 40, are supplied to the data transfer unit 110 #0 of the initial stage. After supplied to the data transfer unit 110 #0, the serial data (SD1), the clock signal (CLK), and the enable signal (ENB) are sequentially transferred to the data transfer unit 120 #1, the data transfer unit 130 #2, and the data transfer unit 140 #3 in the stated order. The serial data (SD1), the clock signal (CLK), and the enable signal (ENB) output from the output end of the data transfer unit 140 #3 of the last stage are output through the serial data output terminal 404, the clock signal output terminal 405, and the enable signal output terminal 406 of the HIFIX 40 to the control section 80.

Figure 3:
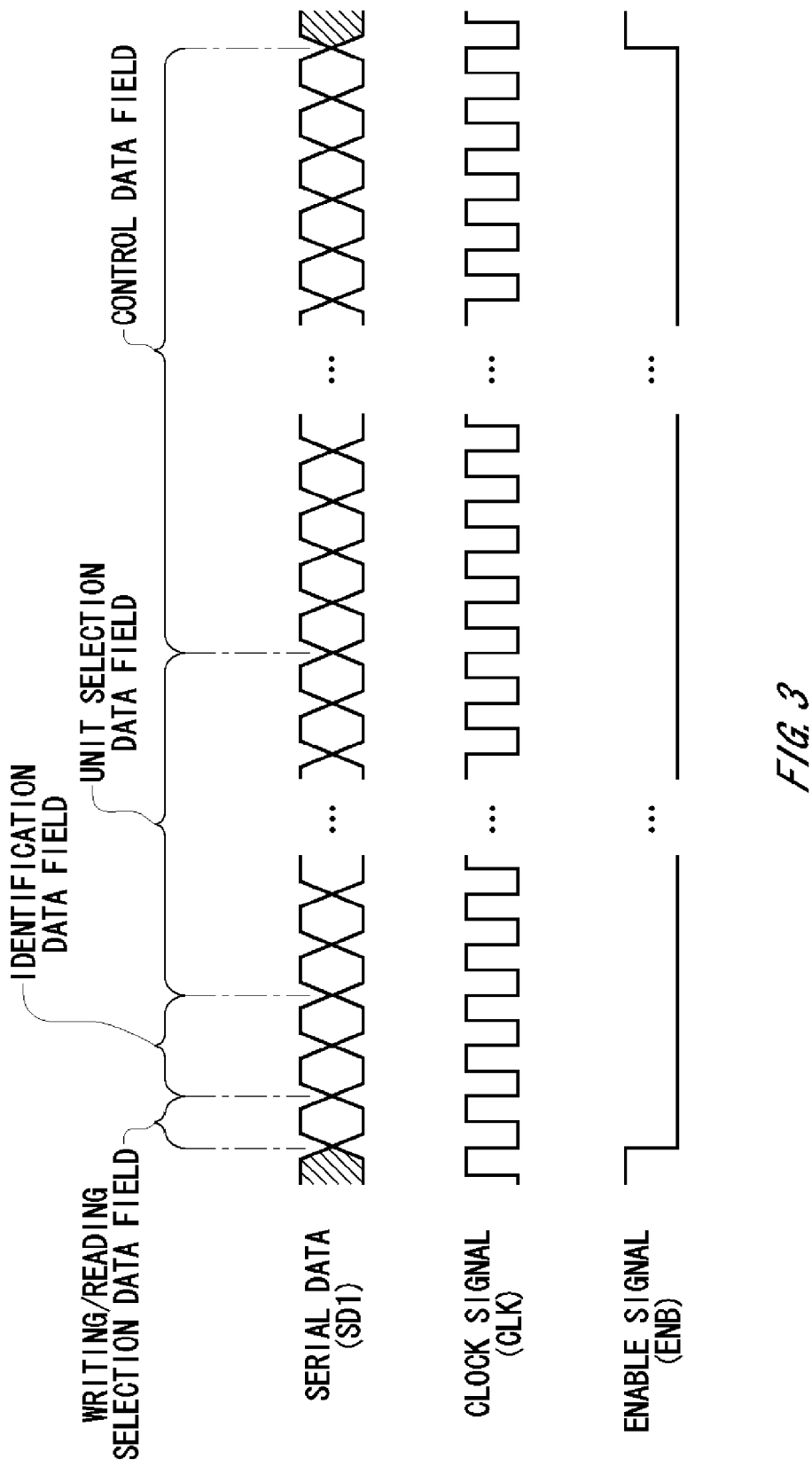
FIG. 3 illustrates exemplary timing waveforms of serial data (SD1), a clock signal (CLK) and an enable signal (ENB) supplied from a control section 80 to the HIFIX 40.

FIG. 3 illustrates exemplary timing waveforms of the serial data (SD1), the clock signal (CLK) and the enable signal (ENB) supplied from the control section 80 to the HIFIX 40. The serial data (SD1) is composed of a plurality of bits arranged in a chronological order in synchronization with the clock signal (CLK), and has a control data field, unit selection data field, a writing/reading selection data field, and an identification data field. Here, the serial data (SD1) is an example of the packet data that is generated by the control section 80 and input into the data transfer units of the HIFIX 40.

The unit selection data field has a plurality of bits in a one-to-one correspondence with a plurality of operational units connected to the data transfer units, and represents unit selection data indicating which one or more of the operational units are selected and designated. Specifically speaking, the unit selection data field has 16 bits each of which corresponds to one of the 16 operational units connected to the four data transfer units 110, 120, 130, and 140. For example, when the respective bits of the unit selection data field correspond in a chronological order to the operational units 210 #0 through 243 #15 and the logical values of the bits of the unit selection data are "0010100000010000," the unit selection data simultaneously selects and designates three operational units 212 #2, 220 #4, and 233 #11. Accordingly, the unit selection data can select and designate a single operational unit, a plurality of operational units, or all the operational units.

The writing/reading selection data field is a 1-bit field in the serial data (SD1) that designates one of the writing mode and the reading mode to one or more operational units. For example, the logic value "1" in the writing/reading selection data field represents writing selection data, and the logic value "0" represents reading selection data.

The control data field represents writing information to be written into one or more operational units when the writing mode is selected and represents reading information read from one or more operational units when the reading mode is selected. The reading information may be sent to the control section 80 from a single operational unit by using a plurality of bits in the serial data (SD1). Alternatively, the reading information may be sent to the control section 80 from a plurality of selected and designated operational units by using a plurality of corresponding bits of the serial data (SD1). Some of the bits of the writing or reading information may be allocated to represent sub-address information. The sub-address information makes it possible to individually control a plurality of control elements included in an operational unit.

When the reading mode is selected, the control section 80 sends dummy data by setting all of the bits reserved for the reading data (the reading field) in the control data field at "0." When a given data transfer unit receives unit selection data selecting and designating any of the operational units connected to the given data transfer unit, the given data transfer unit places reading data from the selected and designated operational units in the reading field by performing a logical OR operation between the reading data from the selected and designated operational units and the data of the reading field of the control data field, or replacing the data of the reading field of the control data field with the reading data from the selected and designated operational units.

The identification data field represents identification data that identifies the correspondence between the data transfer units and the bits of the unit selection data, and is updated by addition of one every time the serial data (SD1) passes through a data transfer unit. Specifically speaking, in the present embodiment where four data transfer units are provided, the identification data field has two bits, and represents identification data that identifies the stage number of each of the four cascade-connected data transfer units 110, 120, 130, and 140 and which ones of the 16 bits of the unit selection data correspond to each of the data transfer units 110, 120, 130 and 140. On reception of the serial data (SD1), each of the data transfer units 110, 120, 130 and 140 refers to the identification data represented by the identification data field of the received serial data (SD1) to determine the stage number of the data transfer unit and the unit numbers of the four operational units connected to the data transfer unit. Each of the data transfer units 110, 120, 130 and 140 changes the value of the identification data of the serial data (SD1) by a predetermined value, every time it transfers the serial data (SD1) to the data transfer unit of the following stage. Specifically speaking, for example, when the data transfer unit 110 receives serial data (SD1) whose identification data takes a value of "00," the data transfer unit 110 adds one to the value of the identification data to generate identification data taking a value of "01" and transfers the updated serial data (SD1) to the data transfer unit 120 of the following stage. When eight data transfer units are provided, the identification data field has at least three bits.

The clock signal (CLK) is synchronized with the serial data (SD1). On reception of the clock signal (CLK), the data transfer units 110, 120, 130 and 140 forward the clock signal (CLK) to the operational units connected to the data transfer units 110, 120, 130, and 140 as the operational clock of the operational units. The control section 80 may not transfer the clock signal (CLK) while not performing the writing and reading operations. When employing an intermittent transmission (burst transmission) scheme to perform the writing and reading operations, the control section 80 may transfer to the data transfer unit of the initial stage a predetermined number of cycles of the clock signal (CLK) before starting to transfer the serial data (SD1) to the data transfer unit of the initial stage. Furthermore, after completing the input of the serial data (SD1), the control section 80 inputs the clock signal (CLK) to the data transfer unit 110 of the initial stage until any number of cycles elapses for causing one or more operational units selected by the unit selection data of the serial data (SD1) to operate. The control section 80 may stop transferring the clock signal (CLK) when a predetermined number of cycles has elapsed after the completion of the input of the serial data (SD1) into the data transfer unit 110 of the initial stage. It should be noted that the number of cycles denotes the number of cycles of the clock signal (CLK) that is a periodic signal. Since the control section 80 does not transfer the clock signal (CLK) while not performing writing or reading operations as discussed above, the test apparatus 10 relating to the present embodiment can prevent the clock signal (CLK) from unnecessarily causing noise in the HIFIX 40 during a test on the device under test 60.

The enable signal (ENB) is a binary signal indicating one of "H" and "L" and defines a valid data range in the serial data (SD1). On reception of the enable signal (ENB) as well as the serial data (SD1) and the clock signal (CLK), the data transfer units 110, 120, 130 and 140 acquires, in accordance with the clock signal (CLK), the data represented by the control data field, the unit selection data field, the writing/reading selection data field, and the identification data field of the serial data (SD1), which are synchronized with, for example, the logic value "L" of the enable signal (ENB).

When receiving the serial data (SD1), the clock signal (CLK), and the enable signal (ENB) having the timing waveforms shown in FIG. 3, the data transfer units 110, 120, 130 and 140 acquire the data represented by the control data field, the unit selection data field, the writing/reading selection data field, and the identification data field of the serial data (SD1) in accordance with the clock signal (CLK).

The following describes a case where the serial data (SD1) transferred to the data transfer unit 110 is the writing selection data. When the identification data and the unit selection data of the serial data (SD1) select the operational units 210, 211, 212 and 213 connected to the data transfer unit 110 of the initial stage, in other words, when the identification data takes a logic value of "00," the data transfer unit 110 acquires the control data contained in the control data field and supplies the control data to the operational units 210, 211, 212 and 213. At the same time, the data transfer unit 110 supplies to each of the operational units 210, 211, 212 and 213, the clock signal (CLK), a writing enable signal (WENB), and a chip select signal (CS). The writing enable signal (WENB) indicates that the selected operational unit should be differently configured by using the supplied control data, and the chip select signal (CS) indicates whether the operational unit is to be selected and subjected to a writing operation.

Here, the chip select signal (CS) supplied to the operational unit 210 corresponds to the initial one bit of the four bits corresponding to the operational units 210, 211, 212 and 213 from among the 16-bit unit selection data in the serial data (SD1). Similarly, the chip select signal (CS) supplied to the operational unit 211 corresponds to the second bit, the chip select signal (CS) supplied to the operational unit 212 corresponds to the third bit, and the chip select signal (CS) supplied to the operational unit 213 corresponds to the fourth bit.

The writing operations are performed by the data transfer units 120, 130 and 140 in a similar manner as the writing operation by the data transfer unit 110. In other words, when receiving the serial data (SD1) whose 2-bit identification data takes an updated logic value of "01," "10," or "11", each of the data transfer units 120, 130 and 140 acquires corresponding four bits from the 16-bit unit selection data and performs a writing operation on one or more operational units selected by the 4-bit unit selection data.

The following describes a case where the serial data (SD1) transferred to the data transfer unit 110 is the reading selection data. When the received serial data (SD1) is reading selection data, the data transfer unit 110 of the initial stage supplies a reading enable signal (RENB) to the operational units 210, 211, 212 and 213. In this case, the reading data read from the selected operational units 210, 211, 212 and 213 is transferred to the data transfer unit 110 to replace the dummy data (zero data) in the control data field in the serial data (SD1). The data transfer unit 110 transfers the serial data (SD1) including the reading data in place of the dummy data to the data transfer unit 120 of the following stage.

The reading operations are performed by the data transfer units 120, 130, and 140 in a similar manner as the reading operation by the data transfer unit 110. In other words, when receiving the serial data (SD1) whose 2-bit identification data takes an updated logic value of "01," "10," or "11," each of the data transfer units 120, 130 and 140 acquires corresponding four bits from the 16-bit unit selection data and reads reading data from one or more operational units selected by the 4-bit unit selection data. The reading data read from the operational units is transferred to the data transfer unit connected to the operational units, placed onto the control data field of the serial data (SD1) by a logical OR operation between the reading data and the data of the control data field, and transferred from the data transfer unit 140 to the control section 80. If desired, the transfer units 120, 130 and 140 may replace the dummy data with the reading data, instead of performing a logical OR operation between the data of the control data field and the reading data.

Figure 4:
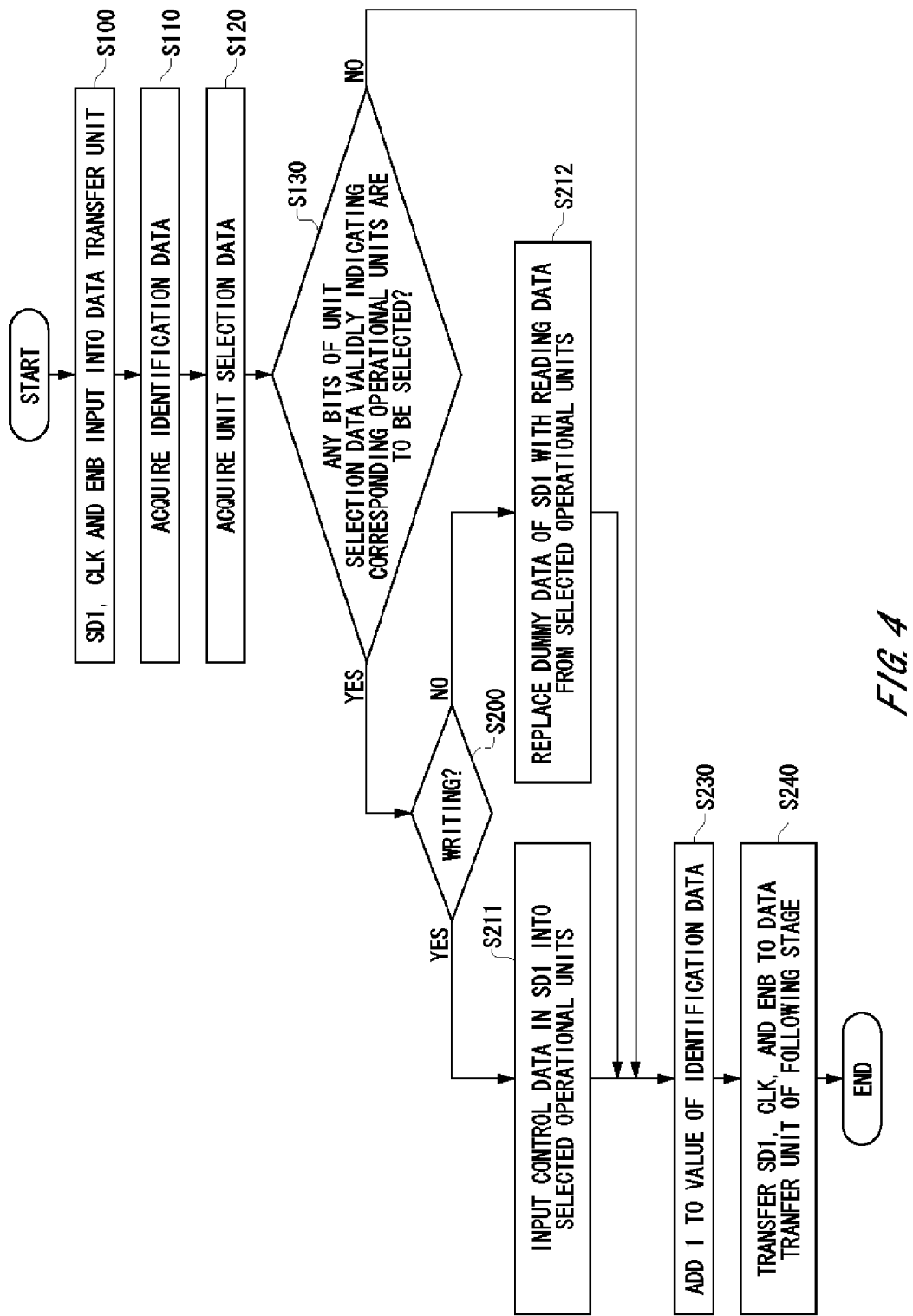
FIG. 4 is a flow chart illustrating the flow of operations to write control data included in the serial data (SD1) into selected operational units in the HIFIX 40 or to read data from the selected operational units.

FIG. 4 is a flow chart illustrating the flow of operations performed by a data transfer unit of the HIFIX 40 to write control data included in the serial data (SD1) into one or more operational units selected by unit selection data or to read data from one or more operational units selected by unit selection data.

To begin with, the serial data (SD1), the clock signal (CLK) and the enable signal (ENB) are transferred from the control section 80 or the data transfer unit of a given stage to the data transfer unit of the initial or following stage (step S100). The data transfer unit then acquires the identification data from the received serial data (SD1) to determine its own stage number (step S110). Subsequently, the data transfer unit acquires corresponding bits from the unit selection data in the received serial data (SD1) (step S120). After this, the data transfer unit determines whether the obtained unit selection data indicates any of the operational units connected to the data transfer unit should be selected (step S130).

When the acquired unit selection data indicates that one or more operational units connected to the data transfer unit should be selected (step S130:YES), the data transfer unit acquires the data contained in the writing/reading selection data field and determines whether the acquired data indicates writing selection data (step S200).

When the data acquired from the writing/reading selection data field indicates writing selection data (step S200:YES), the data transfer unit acquires the control data contained in the control data field of the serial data (SD1) and supplies the acquired control data to the selected operational units as serial data (SD2) (step S211). At the same time, the data transfer unit supplies the clock signal (CLK), the writing enable signal (WENB), and the chip select signal (CS) to the selected operational units.

When the data acquired by the data transfer unit from the writing/reading selection data field indicates reading selection data (step S200:NO), the data transfer unit supplies a reading enable signal (RENB), in place of the writing enable signal (WENB), to the selected operational units. The reading enable signal (RENB) indicates that the selected operational units should transfer to the data transfer unit reading data such as configuration stored thereon. In this case, the data transfer unit replaces the dummy data in the control data field with the reading data read from the selected operational units (step S212).

After completing the step S211 or S212, the data transfer unit adds one to the value of the identification data acquired from the serial data (SD1) (step S230), and transfers the updated serial data (SD1), the clock signal (CLK), and the enable signal (ENB) to the data transfer unit of the following stage or the control section 80 (step S240). Even if the unit selection data acquired by the data transfer unit from the serial data (SD1) indicates none of the operational units connected to the data transfer unit are to be selected in the step S130 (step S130:NO), the data transfer unit still adds one to the value of the identification data acquired from the serial data (SD1) (step S230), and transfers the updated serial data (SD1), the clock signal (CLK), and the enable signal (ENB) to the data transfer unit of the following stage or the control section 80 (step S240). Here, the series of operations are completed.

In the present embodiment, the control section 80 may compare the serial data (SD1) input into the data transfer unit 110 of the initial stage with the serial data (SD1) output from the data transfer unit 140 of the last stage, to judge whether the data transfer units 110, 120, 130 and 140 correctly operate. In this case, the control section 80 preferably compares a portion, excluding the identification data, of the serial data (SD1) input into the data transfer unit 110 of the initial stage with a portion, excluding the identification data, of the serial data (SD1) output from the data transfer unit 140 of the last stage to judge whether the data transfer units 110, 120, 130 and 140 correctly operate.

According to the test apparatus 10 relating to the present embodiment, the HIFIX 40 includes four data transfer units, but the present invention is not limited to such. The HIFIX 40 can include any number of data transfer units. Similarly, the number of the operational units connected to each data transfer unit is not limited to four as described above. For example, each data transfer unit may be connected to a different number of operational units or the same number of operational units.

Having the HIFIX 40 in which each of a plurality of data transfer units is connected to a plurality of operational units, the test apparatus 10 relating to the present embodiment can be provided with additional operational units simply by cascade-connecting a new data transfer unit to which the additional operational units are connected to one or more existing data transfer units. Therefore, the present invention can increase the number of operational units without increasing the number of buses connecting the control section 80 to the HIFIX 40.

According to the test apparatus 10 relating to the present embodiment, the packet data output from the control section 80 to the HIFIX 40 is not limited to serial data (SD1) but may be parallel data, for example. Furthermore, each of the data transfer units 110, 120, 130, and 140 may form a single-piece member with the operational units connected thereto. The HIFIX 40 relating to the present embodiment is shown as an example of a circuit apparatus relating to the present invention. The use of the HIFIX 40 relating to the present embodiment is not limited to the use in the test apparatus 10 but can be made for communication/control of various devices.

Figure 5:
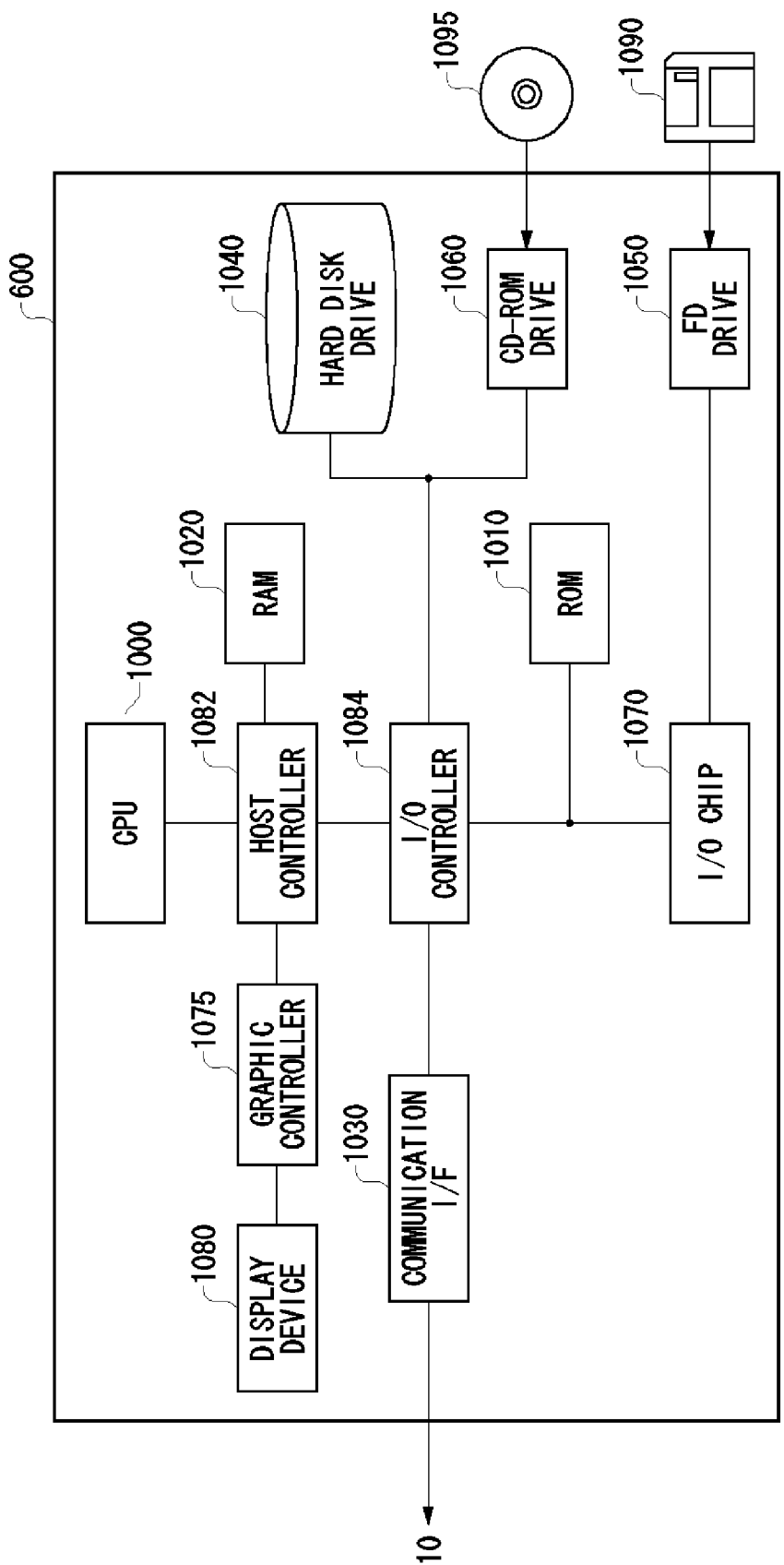
FIG. 5 illustrates an exemplary hardware configuration of a computer 600 running a program to cause the test apparatus 10 to function.

FIG. 5 illustrates an exemplary hardware configuration of a computer 600 running a program to cause the test apparatus 10 to function. The computer 600 is constituted by a CPU surrounding section, an input/output (I/O) section and a legacy I/O section. The CPU surrounding section includes a CPU 1000, a RAM 1020, and a graphic controller 1075 which are connected to each other by means of a host controller 1082. The I/O section includes a communication interface 1030, a hard disk drive 1040, and a CD-ROM drive 1060 which are connected to the host controller 1082 by means of an I/O controller 1084. The legacy I/O section includes a ROM 1010, a flexible disk drive 1050, and an I/O chip 1070 which are connected to the I/O controller 1084.

The host controller 1082 connects the RAM 1020 with the CPU 1000 and graphic controller 1075 which access the RAM 1020 at a high transfer rate. The CPU 1000 operates in accordance with programs stored on the ROM 1010 and RAM 1020, to control the constituents. The graphic controller 1075 obtains image data which is generated by the CPU 1000 or the like on a frame buffer provided within the RAM 1020, and causes the display device 1080 to display the obtained image data. Alternatively, the graphic controller 1075 may include therein a frame buffer for storing thereon the image data generated by the CPU 1000 or the like.

The I/O controller 1084 connects, to the host controller 1082, the hard disk drive 1040, communication interface 1030 and CD-ROM drive 1060 which are I/O devices operating at a relatively high rate. The communication interface 1030 communicates with external apparatuses via the network. The hard disk drive 1040 stores thereon programs and data to be used by the computer 600. The CD-ROM drive 1060 reads programs or data from a CD-ROM 1095, and supplies the read programs or data to the hard disk drive 1040 or the RAM 1020.

The I/O controller 1084 is also connected to the ROM 1010, flexible disk drive 1050 and I/O chip 1070 which are I/O devices operating at a relatively low rate. The ROM 1010 stores thereon a boot program executed by the CPU 1000 at the startup of the computer 600, programs dependent on the hardware of the computer 600, and the like. The flexible disk drive 1050 reads programs or data from a flexible disk 1090, and supplies the read programs or data to the hard disk drive 1040 or the RAM 1020 via the I/O chip 1070. The I/O chip 1070 connects a variety of I/O apparatuses to the computer 600 via the flexible disk 1090, a parallel port, a serial port, a keyboard port, a mouse port or the like.

The programs to be provided to the computer 600 are provided by a user in the state of being stored on a recording medium such as the flexible disk 1090, the CD-ROM 1095, and an IC card. The programs are read from the recording medium via the I/O chip 1070 and/or I/O controller 1084, and the read programs are installed in the computer 600 to be executed. The programs are executed by the computer 600 so that the computer 600 causes the test apparatus 10 to perform certain operations, which are the same as the operations of the test apparatus 10 described above with reference to FIGS. 1 to 4 and thus not explained here.

The programs mentioned above may be stored on an external recording medium. Such a recording medium is, for example, an optical recording medium such as DVD and PD, a magnet-optical recording medium such as MD, a tape medium, a semiconductor memory such as an IC card and the like, in addition to the flexible disk 1090 and CD-ROM 1095. Alternatively, the recording medium may be a storage device such as a hard disk or RAM which is provided in a server system connected to a dedicated communication network or the Internet, and the programs may be provided to the computer 600 via the network.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A test apparatus for testing a device under test, comprising:
   a plurality of operational units that operate in response to control data supplied thereto to test the device under test;
   a control section that generates packet data containing the control data and unit selection data indicating which one or more of the plurality of operational units are to be selected; and
   a plurality of data transfer units that are cascade-connected to each other so that the packet data is transferred from each of the plurality of data transfer units to a data transfer unit of a following stage, each of the plurality of data transfer units corresponding to one or more of the plurality of operational units, wherein
   when each of the plurality of data transfer units receives the packet data whose unit selection data indicates that one or more of the operational units corresponding thereto are to be selected, the data transfer unit inputs the control data contained in the packet data into the selected operational units or reads data from the selected operational units, and
   the unit selection data has a plurality of bits in a one-to-one correspondence with the plurality of operational units, and each of the plurality of data transfer units refers to logic values of the plurality of bits to determine whether one or more of the operational units that are connected to the data transfer unit are to be selected.

2. The test apparatus as set forth in claim 1, wherein each of the plurality of data transfer units adds identification data to the packet data and transfers the resulting packet data to a data transfer unit of a following stage, and the identification data identifies which one or more of the plurality of bits of the unit selection data corresponds to one or more operational units connected to the data transfer unit of the following stage.

3. The test apparatus as set forth in claim 2, wherein the control section determines the logic values of the plurality of bits of the unit selection data that are in a one-to-one correspondence with the plurality of operational units depending on a stage number of a data transfer unit to which each to-be-selected operational unit is connected, and
   each of the plurality of data transfer units changes a value (ID) of the identification data by a predetermined value when the data transfer unit transfers the packet data to the data transfer unit of the following stage.

4. The test apparatus as set forth in claim 3, wherein the control section informs each of the plurality of data transfer units of a location, in the packet data, of a field representing the unit selection data.

5. The test apparatus as set forth in claim 4, wherein each of the plurality of data transfer units reads one or more bits, from the plurality of bits of the unit selection data, that correspond to the operational units connected thereto, by referring to the value of the identification data, the number of operational units connected to each of the plurality of data transfer units, and the location of the field representing the unit selection data in the packet data.

6. The test apparatus as set forth in claim 4, wherein
the control section judges whether the plurality of data transfer units correctly operate by comparing packet data input into a data transfer unit of an initial stage with packet data output from a data transfer unit of a last stage.

7. The test apparatus as set forth in claim 4, wherein
the control section judges whether the plurality of data transfer units correctly operate by comparing (i) a portion, excluding identification data, of packet data input into a data transfer unit of an initial stage with (ii) a portion, excluding identification data, of packet data output from a data transfer unit of a last stage.

8. The test apparatus as set forth in claim 2, wherein
the packet data contains writing selection data indicating that the control data is to be input into the selected operational units or reading selection data indicating that data is to be read from the selected operational units.

9. The test apparatus as set forth in claim 8, wherein
when data is to be read from the selected operational units, the control section generates packet data containing dummy data in accordance with the number of bits of the data to be read from the selected operational units.

10. The test apparatus as set forth in claim 9, wherein the control section:
when data is to be input into the selected operational units, generates unit selection data designating one or more of the plurality of operational units; and
when data is read from the selected operational units, generates unit selection data designating one of the plurality of operational units.

11. The test apparatus as set forth in claim 9, wherein
when each of the plurality of data transfer units receives the packet data including the reading selection data and the unit selection data of the received packet data selects one or more of the operational units connected to the data transfer unit, the data transfer unit transfers the packet data whose dummy data is replaced with data read from the selected operational units to a data transfer unit of a following stage.

12. The test apparatus as set forth in claim 1, wherein
each of the plurality of data transfer units transfers a clock signal to detect the packet data to a data transfer unit of a following stage.

13. The test apparatus as set forth in claim 12, wherein
the control section stops inputting the clock signal into a data transfer unit of an initial stage when a predetermined number of cycles (of the clock signal) has elapsed after completing inputting the packet data into the data transfer unit of the initial stage.

14. The test apparatus as set forth in claim 13, wherein
each of the plurality of data transfer units further transfers the clock signal received from a previous stage to the operational units connected thereto as an operational clock, and
the control section inputs the clock signal into the data transfer unit of the initial stage, after completing inputting the packet data, until a necessary number of cycles elapses for causing one or more operational units selected by the unit selection data of the packet data to operate.

15. The test apparatus as set forth in claim 12, wherein
before starting inputting the packet data into a data transfer unit of an initial stage, the control section inputs into the data transfer unit of the initial stage a predetermined number of cycles of the clock signal.

16. A circuit apparatus comprising:
a plurality of operational units that operate in response to control data supplied thereto;
a control section that generates packet data containing the control data and unit selection data indicating which one or more of the plurality of operational units are to be selected; and
a plurality of data transfer units that are cascade-connected to each other so that the packet data is transferred from each of the plurality of data transfer units to a data transfer unit of a following stage, each of the plurality of data transfer units corresponding to one or more of the plurality of operational units, wherein
when each of the plurality of data transfer units receives the packet data whose unit selection data indicates that one or more of the operational units corresponding thereto are to be selected, the data transfer unit inputs the control data contained in the packet data into the selected operational units or reads data from the selected operational units, and
the unit selection data has a plurality of bits in a one-to-one correspondence with the plurality of operational units, and each of the plurality of data transfer units refers to logic values of the plurality of bits to determine whether one or more of the operational units that are connected to the data transfer unit are to be selected.

* * * * *